United States Patent [19]
Fulcomer

[11] Patent Number: 5,999,984
[45] Date of Patent: *Dec. 7, 1999

[54] COMPUTER MEMORY MODELING DATA STORAGE

[75] Inventor: James L. Fulcomer, Redondo Beach, Calif.

[73] Assignee: Hughes Electronics Corporation, El Segundo, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/878,172

[22] Filed: Jun. 18, 1997

[51] Int. Cl.$^6$ ....................................................... G06F 7/00
[52] U.S. Cl. ................................................................ 709/247
[58] Field of Search ................................. 364/DIG. 1 MS, 364/DIG. 2 FIG; 395/200.3, 200.77, 712; 341/51, 52, 63; 707/3, 4, 102, 103, 203; 340/347 DD; 709/200, 247

[56] References Cited

U.S. PATENT DOCUMENTS 4,494,108  1/1985  Langdon, Jr. et al. .......... 340/347 DD
5,721,543  2/1998  Johnson et al. ............................ 341/50

*Primary Examiner*—Robert B. Harrell
*Attorney, Agent, or Firm*—Vijaylakshmi D. Duraiswamy; Michael W. Sales

[57] ABSTRACT

A method and apparatus for storing memory modeling data (20) in computer memory (76). The memory modeling data (20) is converted into an X-data value (36) according to a first mapping scheme (32). The first mapping scheme (32) associates the value of each digit of the memory modeling data (20) with a predetermined digit which has one of three values. The X-data value (36) is partitioned into subgroups (52). A character is mapped to each of the subgroups (52) according to a second mapping scheme (64). The mapped characters (60) are stored in computer memory (76).

18 Claims, 4 Drawing Sheets

COMPUTER MEMORY MODELING DATA STORAGE

BACKGROUND OF THE INVENTION

1. Field of the Invention

The present invention relates generally to computer memory storage and more particularly to storing modeling data in computer memory.

2. Description of Related Art

Simulations of Very High Speed Integrated Circuit (VHSIC) designs require the use of Hardware Description Languages (HDL's) such as VHDL (VHSIC Hardware Description Language) to model the behavior of hardware components. One class of components that is frequently modeled is memory devices. The memory devices include, for example: random access memory devices (RAM), read-only memory devices (ROM), and electrically erasable read only memory devices (EEPROM).

Existing VHDL memory models use an array of standard logic vector (std_logic_vector) variables to represent memory modeling data. For a description of std_logic_vector variable formats, see the following reference: IEEE STD 1164-1993 "IEEE Standard Multivalue Logic System for VHDL Model Interoperability (std_logic_1164)." The std logic_vector format requires approximately anywhere from eight bytes to eleven bytes to represent one byte of modeled memory. Consequently, a 64 megabyte (Mbyte) memory model may require as much as 704 Mbytes of workstation memory.

This large memory storage requirement mandates the use of workstations with large memory storage capacities. Moreover, the storage requirement significantly slows down the simulation program since, among other reasons, swapping may be required if the workstation is not capable of holding the entire simulation data in the workstation's available RAM. Hardware accelerators can be used to speed up the simulation. However, hardware accelerators are relatively expensive and may cost more than $2 million for one accelerator.

SUMMARY OF THE INVENTION

The present invention is a method and apparatus for storing modeling data in computer memory. The modeling data has digits. The digits of the memory modeling data are partitioned into subgroups of a predetermined size. A character is mapped to each of the subgroups according to a character mapping scheme. The mapped characters are stored in the memory.

Additional advantages and features of the present invention will become apparent from the subsequent description and the appended claims, taken in conjunction with the accompanying drawings in which:

DESCRIPTION OF THE PREFERRED EMBODIMENTS

Figure 1:
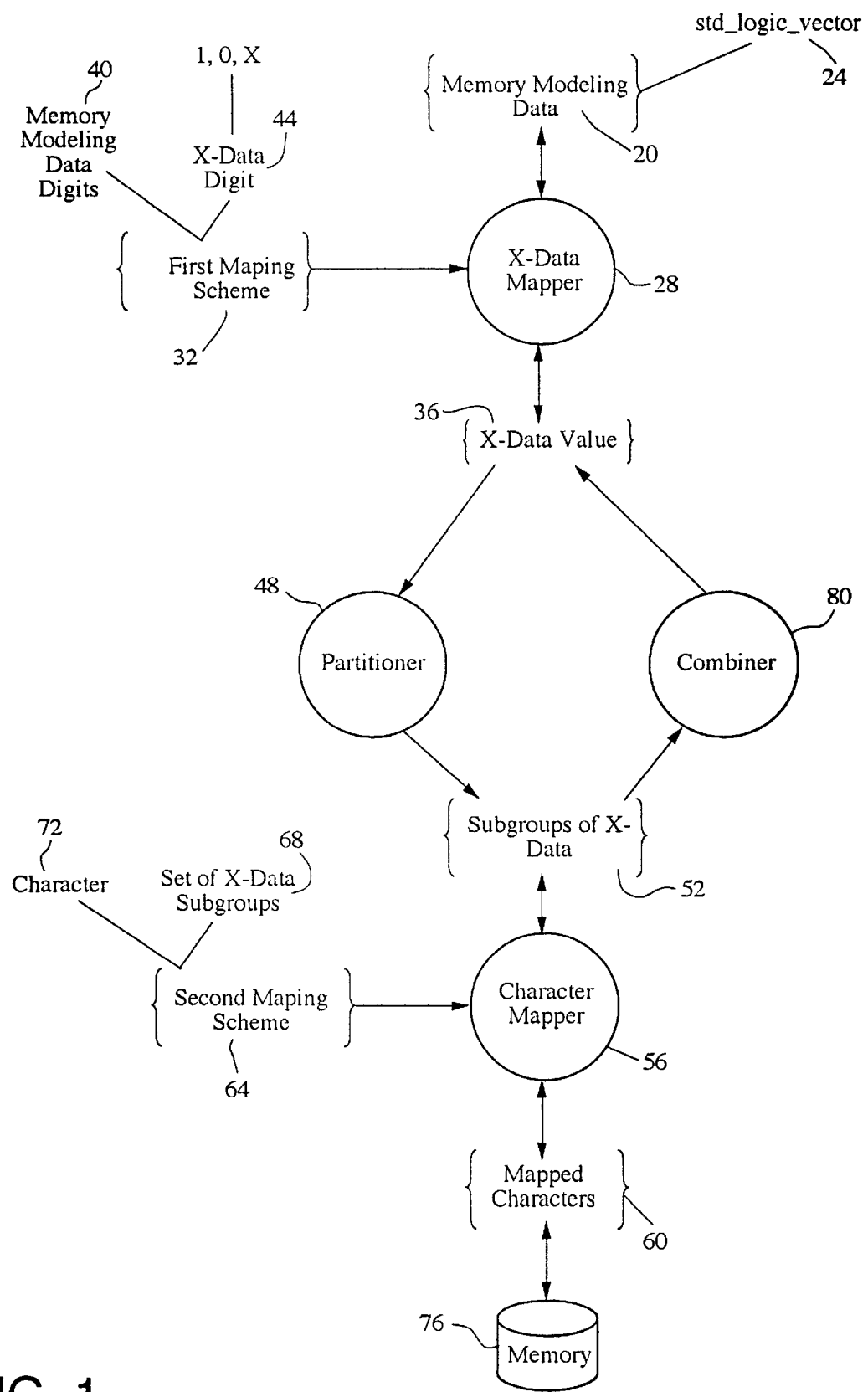
FIG. 1 is an entity relationship diagram showing the interrelationships among the components of the present invention.

Referring to FIG. 1, memory modeling data 20 which is in the form of a std_logic_vector format 24 is to be stored according to the techniques of the present invention. The memory modeling data 20 is converted into an X-data format by an X-data mapper 28. The X-data mapper 28 uses a first mapping scheme 32 in order to convert the memory modeling data 20 into an X-data value 36.

The first mapping scheme 32 maps each digit of the memory modeling data 20 into a corresponding X-data digit. For the preferred embodiment, the first mapping scheme 32 is a look-up data table which maps unique modeling data digits 40 to an X-data digit 44.

The first mapping scheme 32 recognizes that a thorough computer memory simulation can often be accomplished by storing three of the std_logic_vector's nine possible state values. Accordingly, the X-data digit 44 has three possible values in the preferred embodiment: 1, 0, X. The first mapping scheme 32 has the following values in the preferred embodiment:

| std logic vector | X-Data Value |
| --- | --- |
| U | X |
| — | X |
| X | X |
| W | X |
| Z | X |
| 1 | 1 |
| H | 1 |
| 0 | 0 |
| L | 0 |

Partitioner 48 partitions the X-data value 36 into subgroups of X-data 52. for the preferred embodiment, each subgroup of X-data 52 has a length of four digits. However, it is to be understood that the present invention is not limited to four digits, but is merely the preferred length to be used.

A character mapper 56 maps each of the subgroups of X-data 52 into a corresponding set of mapped characters 60 according to a character mapping scheme (i.e., embodiment, the second mapping scheme 64 is a look-up data table which maps each unique set of X-data subgroup 68 to a unique character 72. The mapped characters 60 are stored in computer memory 76. Also, the number of bytes for the mapped character 60 is automatically provided by the VHDL computer environment. Other hardware description languages also provide a similar feature.

For the preferred embodiment, the second mapping scheme 64 has the following values:

| | | |
|---|---|---|
| 'F' → "1111", | 'E' → "1110", | 'D' → "1101", |
| 'C' → "1100", | 'B' → "1011", | 'A' → "1010", |
| '9' → "1001", | '8' → "1000", | '7' → "0111", |
| '6' → "0110", | '5' → "0101", | '4' → "0100", |
| '3' → "0011", | '2' → "0010", | '1' → "0001", |
| '0' → "0000", | 'a' → "111X", | 'b' → "110X", |
| 'c' → "11X1", | 'd' → "11X0", | 'e' → "11XX", |
| 'f' → "101X", | 'g' → "100X", | 'h' → "10X1", |
| 'i' → "10X0", | 'j' → "10XX", | 'k' → "1X11", |
| 'l' → "1X10", | 'm' → "1X1X", | 'n' → "1X01", |
| 'o' → "1X00", | 'p' → "1X0X", | 'q' → "1XX1", |
| 'r' → "1XX0", | 's' → "1XXX", | 't' → "011X", |
| 'u' → "010X", | 'v' → "01X1", | 'w' → "01X0", |
| 'x' → "01XX", | 'y' → "001X", | 'z' → "000X", |
| 'G' → "00X1", | 'H' → "00X0", | 'T' → "00XX", |

-continued

| | | | | | |
|---|---|---|---|---|---|
| 'J' → | "0X11", | 'K' → | "0X10", | 'L' → | "0X1X", |
| 'M' → | "0X01", | 'N' → | "0X00", | 'O' → | "0X0X", |
| 'P' → | "0XX1", | 'Q' → | "0XX0", | 'R' → | "0XXX", |
| 'S' → | "X111", | 'T' → | "X110", | 'U' → | "X11X", |
| 'V' → | "X101", | 'W' → | "X100", | 'Y' → | "X10X", |
| 'Z' → | "X1X1", | '!' → | "X1X0", | '@' → | "X1XX", |
| '#' → | "X011", | '$' → | "X010", | '%' → | "X01X", |
| '"' → | "X001", | '&' → | "X000", | '*' → | "X00X", |
| '(' → | "X0X1", | ')' → | "X0X0", | '_' → | "X0XX", |
| '+' → | "XX11", | '-' → | "XX10", | '=' → | "XX1X", |
| '?' → | "XX01", | '>' → | "XX00", | '<' → | "XX0X", |
| '~' → | "XXX1", | '`' → | "XXX0", | 'X' → | "XXXX"; |

Significantly, the present invention allows, in some situations, two bytes to represent one byte of memory modeling data 20. For example, a 16 Mbyte std_logic_vector model required 141 Mbytes of workstation memory. The present invention required 30 Mbytes of workstation memory to represent the same 16 Mbyte std_logic_vector model.

To retrieve the stored mapped characters 60, the process is essentially reversed. The mapped characters 60 are retrieved from computer memory 76 using the stored address location to locate the desired mapped characters 60.

In the preferred embodiment, the present invention is implemented as a VHDL computer subroutine which is called by the VHDL simulation program whenever it was to store or retrieve data from computer memory 76. However, it is to be understood that the present invention is not limited to this implementation, but includes such other embodiments as being coded in other computer languages, such as C.

The mapped characters 60 are converted into subgroups of X-data 52 by the character mapper 56. A combiner 80 concatenates the subgroups of X-data into the X-data value 36. The X-data mapper 28 converts the X-data value 36 into the memory modeling data 20.

The preferred embodiment uses X-data mapper 28 with three values. However, it is to be understood that the present invention is not limited to the use of X-data mapper 28 or to the use of three values. For example in an alternate embodiment, the present invention does not use an X-data mapper but groups the digits of the memory modeling data 20 into subgroups which are then mapped to mapped characters 60 by character mapper 56. Accordingly, the second mapping scheme 64 would map a character 72 to a set of digits of memory modeling data 20.

Moreover, the present invention is not limited to the use of three values. The present invention includes the use of two or more digits to represent the digits of memory modeling data 20. The requirements of the simulation determine the level of granularity of the information which needs to be stored. For example, the preferred embodiment used three values since the simulation only needed a level of granularity of three pieces of information: whether the value is high ("1"), low ("0") or unknown ("X"). A two value digit can be used if the level of granularity requires two pieces of information.

Additionally, the size of the subgroups could be varied to store more or less information depending on the level of granularity needed by the simulation. For example, if the desired level of granularity required four pieces of information, then the size of the subgroup can be varied so that it can be mapped to a unique character. Moreover, reduction in the memory storage requirement through the techniques of the present invention is achieved when all nine std_logic variables have to be stored.

Also, the present invention does not partition the memory modeling data if the memory modeling data is already sized so that it can be mapped to a unique character by the character mapper 56.

Figure 2:
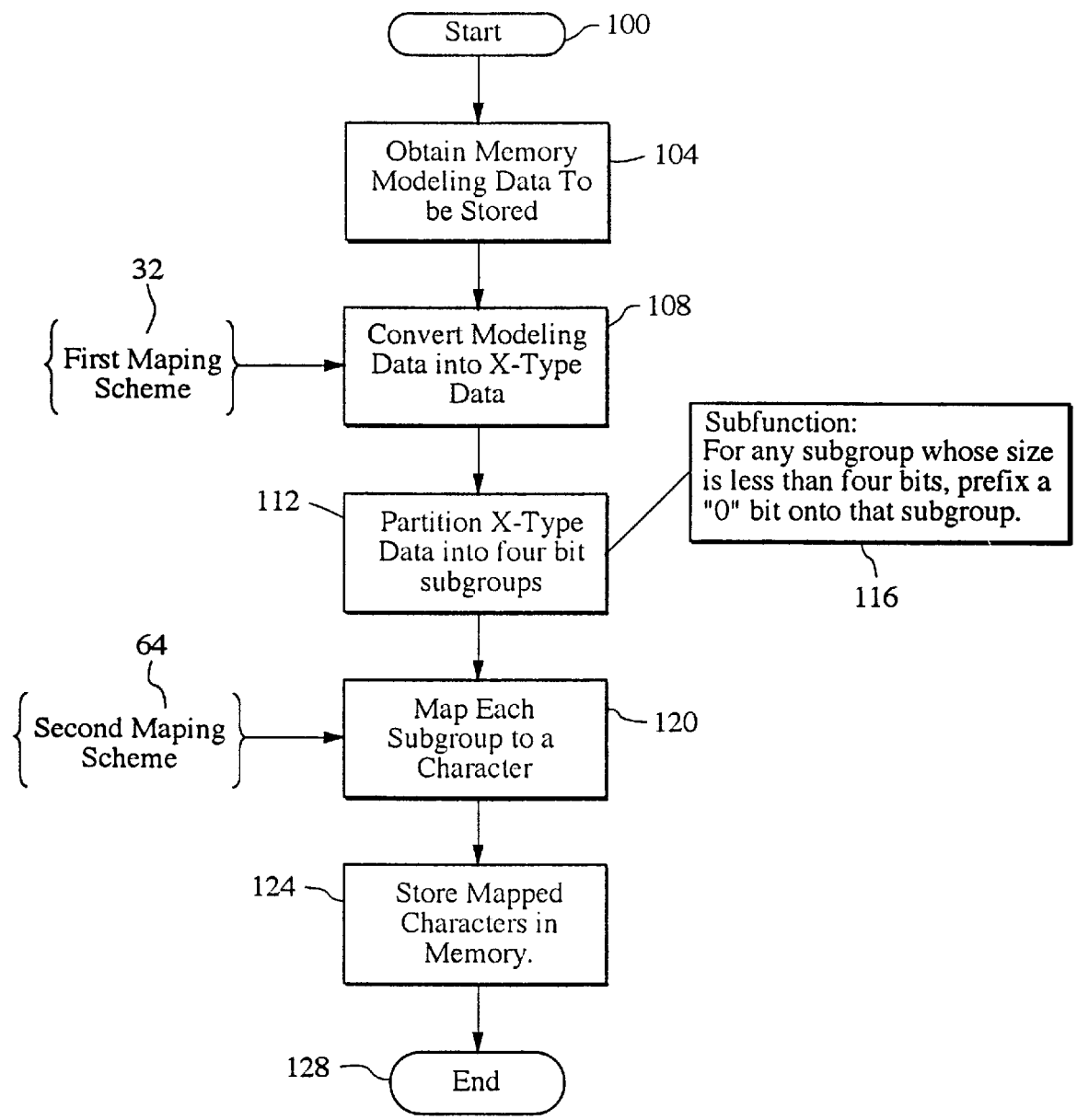
FIG. 2 is a flow chart depicting the functional sequence for converting data into a compressed memory storage format.

FIG. 2 is a flow chart depicting the functional sequence for storing a compressed version of the memory modeling data 20. The start indication block 100 indicates that block 104 is to be first executed. Block 104 obtains from the computer program the memory modeling data which is to be stored in the computer memory. Block 108 converts the obtained memory modeling data into X-type data according to the first mapping scheme 32. Block 112 partitions the X-type data into four-bit subgroups. Block 112 contains a subfunction 116 which, for the preferred embodiment, prefixes a sufficient number of bits whose values are zero onto any subgroup whose size is less than four bits. The prefixing makes that subgroup's length equal to four bits.

Also, it is to be understood that the present invention also allows the mapping of data into X-data and the partitioning of the data into subgroups to be flexible steps in that the order in which those two operations occur can be reversed. Accordingly, the present invention includes the partitioning step occurring before the X-data mapping step. Block 120 maps each subgroup to a character according to the second mapping scheme 64. Block 124 stores the mapped characters in computer memory before terminating at end block 128.

Figure 3:
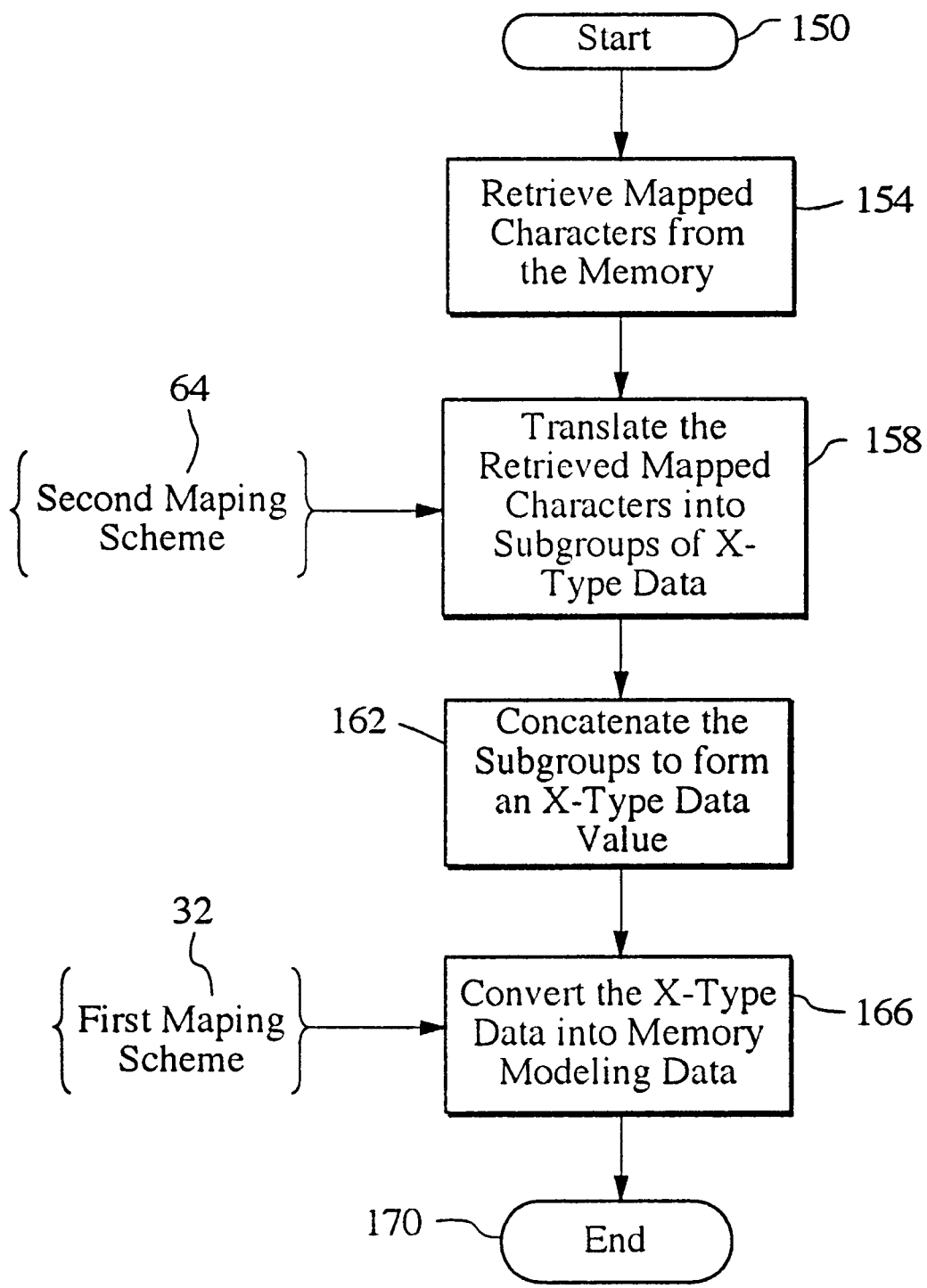
FIG. 3 is a flow chart depicting the functional sequence for retrieving memory modeling data which has been stored according to the techniques of the present invention.

FIG. 3 is a flow chart detailing the functional sequence for retrieving the compressed data stored in computer memory. The start block 150 indicates that block 154 is to be executed. Block 154 retrieves the mapped characters from the computer memory. Block 158 translates the retrieved mapped characters into subgroups of X-type data according to the second mapping scheme 64.

Block 162 concatenates the four-bit subgroups to form an X-type data value. Block 166 converts the X-type data value into the memory modeling data according to the first mapping scheme 32. Processing terminates at end block 170.

Figure 4:
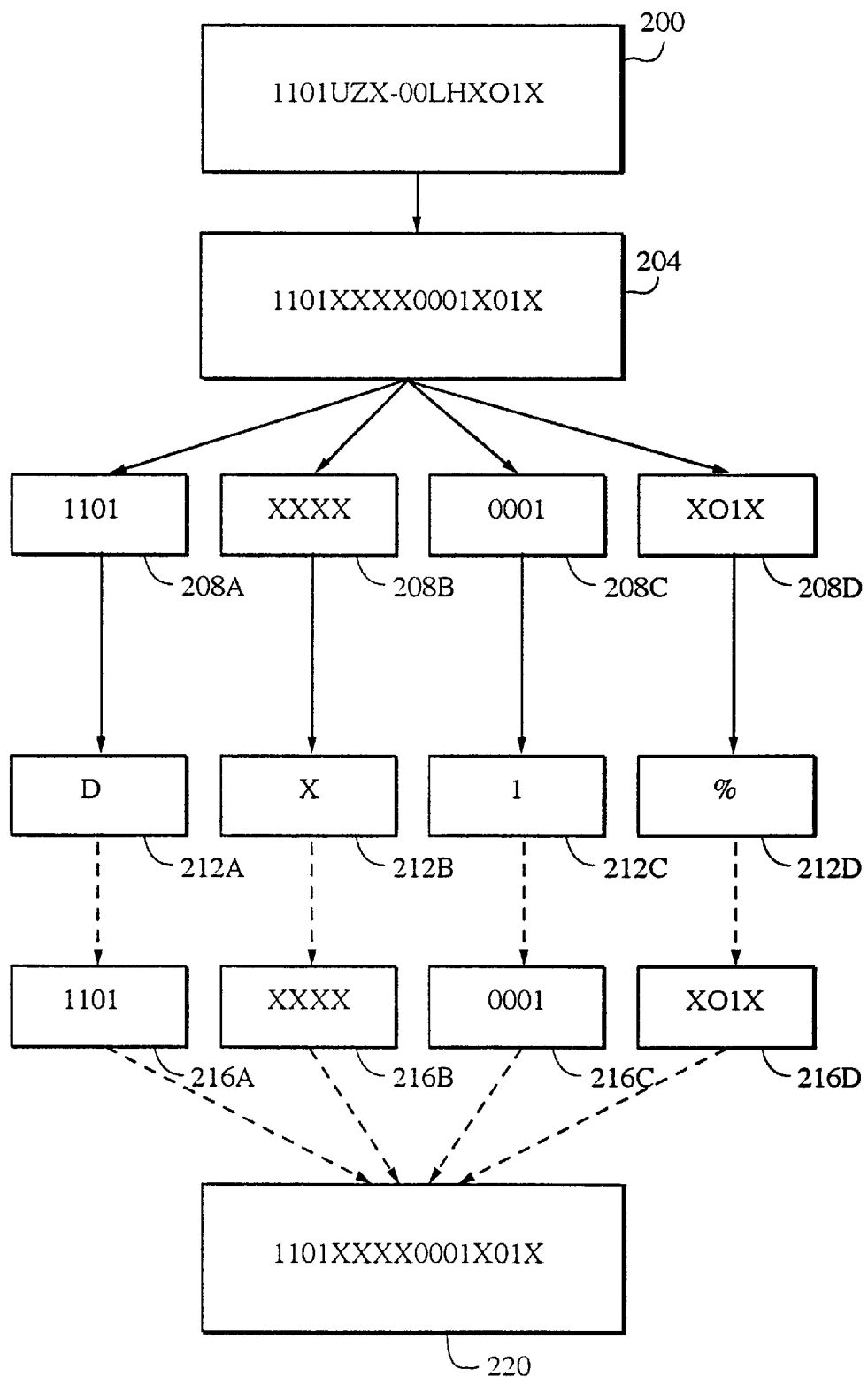
FIG. 4 is a flow diagram illustrating the data compression and retrieval techniques of the present invention.

FIG. 4 illustrates the compression and decompression of a sample std_logic_vector 200. The std_logic_vector 200 is converted into X-data 204. The X-data 204 is partitioned into four subgroups: subgroup 208A; subgroup 208B; subgroup 208C; and subgroup 208D.

Each X-data subgroup is converted into a character according to the second mapping scheme. Accordingly, X-data 208A is converted into the character "D" 212A; X-data subgroup 208B is converted into character "X" 212B; X-data subgroup 208C is converted into character "1" 212C; and subgroup 208D is converted into character "%" 212D. Each of these converted characters are then stored in computer memory.

Upon retrieval, each converted character is mapped back into its appropriate X-data subgroup (216A, 216B, 216C, and 216D) for subsequent translation back into the std_logic_vector 220.

The embodiments which have been set forth above for the purpose of illustration were not intended to limit the invention. It will be appreciated by those skilled in the art that various changes and modifications may be made to the embodiments discussed in the specification without departing from the spirit and scope of the invention as defined by the appended claims.

What is claimed is:

1. A method for storing modeling data in computer memory, said modeling data having digits comprising the steps of:

partitioning the digits of the memory modeling data into subgroups of a predetermined size;

providing a predetermined character mapping scheme containing associations between each said subgroup and a unique predetermined character;

mapping each of said subgroups to a character according to said character mapping scheme; and storing said characters in said memory.

2. The method according to claim 1 wherein said modeling data is used within a very high speed integrated circuit hardware description language environment.

3. The method according to claim 2 wherein said modeling data is std_logic_vector data.

4. The method according to claim 1 further comprising the step of:

converting the modeling data into a converted data value according to a predetermined first mapping scheme, said first mapping scheme associating the value of each digit of said modeling data with a predetermined digit, said digits of said converted data value having at least two predetermined values.

5. The method according to claim 4 wherein said predetermined values include values of 1, 0, and X.

6. The method according to claim 1 further comprising the step of:

providing a lookup table to store said character mapping scheme.

7. The method according to claim 1 wherein said predetermined size is four bits in size.

8. The method according to claim 1 further comprising the step of:

affixing a digit onto the subgroup whose size is less than said predetermined size.

9. The method according to claim 1 wherein said modeling data is used within a computer hardware description language environment.

10. The method according to claim 1 further comprising the steps of:

retrieving said characters from said memory;

translating said characters into said subgroups of data according to said character mapping scheme;

concatenating said subgroups of data of said translating step to form said converted data value; and converting said converted data value into said first datum according to said first mapping scheme.

11. An apparatus for storing modeling data in computer memory, said modeling data having digits, comprising:

a partitioner for partitioning said modeling data into subgroups of a predetermined size;

a predetermined character mapping scheme for mapping subgroups of predetermined values indicative of said modeling data with character values wherein said predetermined character mapping scheme contains associations between each said subgroup and a unique predetermined character; and a character mapper for converting each subgroup into a character based upon said character mapping scheme;

wherein said converted subgroups are stored in the computer memory.

12. The apparatus according to claim 11 wherein said modeling data is used within a very high speed integrated circuit hardware description language environment.

13. The apparatus according to claim 12 wherein said modeling data is std_logic_vector data.

14. The apparatus according to claim 11 wherein said predetermined values include values of 1, 0, and X.

15. The apparatus according to claim 11 wherein said predetermined size is four bits in size.

16. The apparatus according to claim 11 wherein said partitioner affixes at least one x-data value onto a subgroup of data whose size is less than said predetermined size.

17. The apparatus according to claim 11 wherein said modeling data is within a computer hardware description language environment.

18. The apparatus according to claim 11 further comprising:

a first data table, said first data table associating the digits of said modeling data to an x-data value, each of said x-data values having one of three predetermined values; and an x-data mapper for converting each digit of said memory modeling data into an x-data value based upon said first data table to produce a converted x-data value, said converted x-data value being indicative of the memory modeling data.

* * * * *